(12) United States Patent
Degrenne et al.

(10) Patent No.: US 11,378,612 B2
(45) Date of Patent: Jul. 5, 2022

(54) DEVICE AND METHOD FOR MONITORING THE HEALTH OF A POWER SEMICONDUCTOR DIE

(71) Applicant: MITSUBISHI ELECTRIC CORPORATION, Tokyo (JP)

(72) Inventors: Nicolas Degrenne, Rennes (FR); Stefan Mollov, Rennes (FR); Jeffrey Ewanchuk, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 156 days.

(21) Appl. No.: 16/479,850

(22) PCT Filed: Feb. 26, 2018

(86) PCT No.: PCT/JP2018/008189
§ 371 (c)(1),
(2) Date: Jul. 22, 2019

(87) PCT Pub. No.: WO2018/180222
PCT Pub. Date: Oct. 4, 2018

(65) Prior Publication Data
US 2021/0172994 A1    Jun. 10, 2021

(30) Foreign Application Priority Data
Mar. 29, 2017  (EP) .................................... 17305366

(51) Int. Cl.
*G01R 31/26* (2020.01)
*G01N 21/95* (2006.01)
*G01R 31/265* (2006.01)

(52) U.S. Cl.
CPC ..... *G01R 31/2642* (2013.01); *G01N 21/9501* (2013.01); *G01R 31/2644* (2013.01); *G01R 31/2656* (2013.01)

(58) Field of Classification Search
CPC ........... G01N 21/9501; G01N 21/8422; G01R 31/2642; G01R 31/2644; G01R 31/2656;
(Continued)

(56) References Cited

U.S. PATENT DOCUMENTS 4,216,486 A * 8/1980 Geddes .................. G01D 5/268
257/84
4,790,620 A * 12/1988 Niwayama ........... G02B 6/4206
250/227.24
(Continued)

FOREIGN PATENT DOCUMENTS

GB    2 052 054 A    1/1981
JP    S55-162073 A   12/1980
(Continued)

OTHER PUBLICATIONS

Notice of Reasons for Refusal issued in corresponding Japanese Application No. 2019-525028 dated Jul. 6, 2020.

*Primary Examiner* — Vinh P Nguyen
(74) *Attorney, Agent, or Firm* — Birch, Stewart, Kolasch & Birch, LLP (57) ABSTRACT

A device having at least one power semiconductor die coated with a metallization and at least one light guide having two opposite ends. The first end is able to be connected at least to a light source and to a light receiver. The second end is permanently fixed facing to a surface of the metallization such that to form a light path towards said surface and a light path from said surface.

17 Claims, 10 Drawing Sheets

(58) Field of Classification Search
CPC ............... G01R 31/311; G01R 31/308; G01R 31/31728; G01R 1/071; G01R 31/2851; G01R 31/318511; G01R 33/26; G01R 31/28; G01R 31/305; G01R 31/302; G01R 23/17; G01R 31/00; G01R 31/303; G01R 15/241; G01R 31/307; G01R 15/22; G01R 31/002; G01R 31/2653; G01R 1/07; G01R 19/0061; G01R 31/265; G01R 21/8422; H01L 2224/8592; H01L 2224/40225; H01L 2224/4846; H01L 2224/48137; H01L 2224/4917; H01L 2224/49111; H01L 23/3735; H01L 2224/48139; H01L 23/34; H01L 25/167; H01L 21/268; H01L 29/1608; H01L 2924/14; G01D 5/35316; G01K 1/14; G01K 11/125; G01B 11/16; G02B 6/00; G02B 6/4292; G02B 6/4214; G02B 6/43; G02B 6/4206; G02B 6/423; G02B 6/12019; G02B 6/4249; G02B 6/42; G02B 6/4286; G02B 6/4243; G02B 6/4244; G02B 2006/12121; G02B 6/122; G02B 2006/12147; G02B 6/29317; G02B 19/0066; G02B 21/0032; G02B 2006/12111; G02B 6/0088; G02B 27/62; G02B 6/368; G02B 6/06; G02B 6/3644; G02B 6/3668; G02B 6/3672; G02B 6/4219; G06F 1/3203; G01J 5/08; G01J 5/0808; G01J 5/58; H01H 1/0036; H01H 2001/0084; F21K 9/00; F21V 29/70; F21V 29/80

See application file for complete search history.

(56) References Cited

U.S. PATENT DOCUMENTS

| | | | | |
|---|---|---|---|---|
| 4,948,960 | A * | 8/1990 | Simms | H04B 10/43 250/227.11 |
| 4,996,439 | A | 2/1991 | Linker | |
| 5,140,152 | A * | 8/1992 | Van Zeghbroeck | G02B 6/4246 250/214 A |
| 5,170,312 | A * | 12/1992 | Davies | H01L 24/49 361/100 |
| 6,272,015 | B1 * | 8/2001 | Mangtani | H05K 7/1432 361/707 |
| 6,462,814 | B1 | 10/2002 | Lo | |
| 6,844,928 | B1 * | 1/2005 | Gilfeather | G01N 21/9501 356/237.5 |
| 6,950,193 | B1 | 9/2005 | Discenzo | |
| 2006/0138368 | A1 | 6/2006 | Lee | |

FOREIGN PATENT DOCUMENTS

| | | |
|---|---|---|
| JP | H06-209520 A | 7/1994 |
| JP | 2003-527597 A | 9/2003 |
| WO | WO 01/69205 A1 | 9/2001 |

* cited by examiner

DEVICE AND METHOD FOR MONITORING THE HEALTH OF A POWER SEMICONDUCTOR DIE

TECHNICAL FIELD

The invention pertains to the technical field of power semiconductors. More specifically, the invention is related to a device comprising such a power semiconductor and a method to monitor such a device.

BACKGROUND ART

Usually, in a power semiconductor device, one or several power semiconductor dies are mechanically, thermally, and electrically attached to a substrate. The bottom-side of the die is typically soldered or sintered to the substrate. The top-side is typically connected to bond wires.

Such devices are submitted to high thermic changes and high thermo-mechanical stresses. Due to the wide variety in the compositions and structures of the different parts constituting the devices, cracks, voids, delamination and other effects lead to failure of the interconnections. Such failures are very difficult to predict or to detect before the general breakdown of the device.

In service, such devices are generally difficult to access, for example sealed into a non-removable hermetic casing. An inspection of each device is economically not reasonable, especially when many devices are equipped on an entire vehicle fleet in services, like trains, or windmills which are difficult to access. Generally, a theoretical period of lifetime is arbitrarily fixed for all the devices of a set. They are replaced only after an effective and unexpected failure or when the arbitrary period of lifetime is exceeded, regardless of the real state of the devices.

In some cases, the electrical resistance and/or the temperature are measured. The temperature cycles can be counted. To count the temperature cycles, the die temperature is estimated and the temperature excursions are counted. A damage model such as Coffin Manson type can be used to estimate the damage associated with each temperature cycle. A damage accumulation rule is used to sum the damage of each temperature excursion and estimate the overall state of health. This enables to slightly adapt the period of lifetime in function of the conditions undergone by the device. Such estimations are based on stress counting, not on state of the device itself. The estimation is imprecise. The state of the device itself is unknown.

To measure the electrical resistance, voltage across the structure is measured at high current. It gives an indication about the top side interface only of the semiconductors stacking. To measure the thermal resistance, the die temperature is estimated either with a dedicated sensor. This provides indications which are essentially relevant for the bottom side interface. Such estimations are based on condition monitoring. They require the accurate measurement of voltages and/or current and/or temperature.

SUMMARY OF INVENTION

The invention improves the situation.

The applicant proposes a device comprising at least one power semiconductor die coated with a metallization and at least one light guide having two opposite ends, a first end being able to be connected at least to a light source and to a light receiver, the second end being permanently facing to a surface of the metallization such that to form a light path towards said surface and a light path from said surface.

Such a device is adapted to be checked without disassembly operation. A diagnostic tool can be temporarily plugged to the device, for example during a maintenance operation. The device can also include an embedded diagnostic tool permanently associated to the power semiconductors to automatically monitor the device health and to generate specific signals such as a periodic report and/or an alert when a defect is detected. As a consequence, an adapted maintenance operation, including a replacement of the device, can be planned before dysfunction and only if really needed.

In another aspect of the invention, the applicant proposes a method to monitor a power semiconductor die coated with a metallization comprising:
  fixe permanently a light guide facing to a surface of the metallization,
  collect through said light guide a light beam reflected on said surface,
  convert the collected light beam into an electric signal,
  compare said signal to at least one reference,
  generate a monitoring signal in function of the result of the comparison.

The device and/or the method can comprise the following features, separately or in combination one with the others:
  The device further comprises a light source and a light receiver both connected to the first end of the light guide. At least the light receiver is able to be connected to a processor. Such a device is ready to be used by a maintenance operator. Standard ports of the light source and the light receiver can be used to connect any command equipment, for example a computer on which compatible and updated software is installed. The checking operations, for example during maintenance, are easier.
  The device further comprises a processor connected at least to the light receiver. The processor is arranged to compare properties of the light collected by the light receiver to at least one reference. The reference comprises at least one of the followings:
    a predetermined value,
    the intensity of the light emitted by the light source, the processor being further connected to the light source,
    an intensity of the light collected by the light receiver in the past,
    the intensity of the light collected by a second light receiver to which the processor is connected, and
    the wavelength of the light emitted by the light source, the processor being further connected to the light source,
    the processor being further arranged to generate a monitoring signal in function of the result of the comparison. The monitoring signal can be emitted, including during normal operation of the power semiconductor die and not only during maintenance operations. For example, each device equipped in a vehicle or a windmill can transmit automatically a monitoring signal to distant control equipment. A fleet of vehicles such as train or a fleet of windmills can be monitored without costly maintenance operations.
  The device further comprises at least one light splitter disposed on a light path between the first end of the light guide and at least a light source or a light receiver. A single light guide, for example an optical fiber, can be sufficient to carry the light wave in the two opposite directions.

The light guide includes at least two light paths. The first light path is arranged to guide a light beam from the first end until said surface of the metallization. The second light path is arranged to guide a light beam from the second end until the first end of the light guide. The light source and the light receiver can be disposed in distant positions. This enables to adapt the device to overcrowded environments.

The conformation of a terminal surface of the second end of the light guide and the relative position of the second end with respect to the surface of the metallization are conjointly selected such that the most part of the light output from the first light path is reflected on an area of the surface and then takes the second light path. In such embodiment, the initial state of the surface corresponds to a maximum collected light. Then, when the state of surface is degrading, the quantity of collected light decreases. Due to the maximum quantity of the collected light at the beginning, the accuracy of the measurement is enhanced.

The device further comprises an infra-red light receiver connected to the first end of the light guide. Such a device can be used both to monitor the state of the surface and the temperature of the surface. No supplementary equipment is necessary.

The device comprises at least two power semiconductor dies coated with a metallization and each associated to a respective light guide, each having a first end and a second opposite end. The two first ends are connected to a common light source through a light splitter and being connected to a common light receiver through a light coupler. The two second ends are permanently fixed facing to the surface of the respective metallization such that to form a respective light path until said surface and/or a respective light path from said surface. With a single pair of light source and light receiver, a plurality of power semiconductor dies can be monitored.

The device comprises N power semiconductor dies coated with a metallization, N being superior or equal to two, and a common light guide. The light guide includes N distinct second ends being permanently fixed facing to a respective surface of each metallization such that to form a light path until a first of the N surfaces and to form a light path from the last of the N surfaces. The light guide further includes N−1 intermediate light paths between the second ends each arranged to collect a light beam reflected from one of the N surfaces and to guide said light beam until another surface of the N surfaces. With a single pair of light source and light receiver, a plurality of power semiconductor dies can be monitored. The number of light paths (for example optical fibers) is restricted. The monitoring is a serial monitoring. A single light beam is sufficient to detect any deficiency of a single power semiconductor die.

The device further comprises an assembling material between the second end and the surface. The composition and the thickness of said assembling material are selected to have an attenuation inferior to 2 dB/m for the wavelength of the light source when the temperature is comprised between −40° C. and 150° C. Such an assembling material enables to preserve a good transmission of the light guide, including when an opaque filler material is after injected over the power semiconductor dies.

In the method, the fixing is implemented is such a manner to collect a light beam reflected on the surface having an intensity which depends on the roughness of said surface. In such a method, it is not necessary to precisely dispose the light guide. The initial quantity of the collected light is considered as a reference. Any change of the quantity (increasing or decreasing) in the future could be interpreted as a defect in the roughness of the surface and consequently a degradation of the power semiconductor die(s).

In the method, comparing the signal to at least one reference includes:
filtering the electrical signal and/or fitting the electrical signal to a reference curve.

The method further comprises extrapolating from said signal an estimation of the end of life and/or of the remaining useful life of said power semiconductor die.

The monitoring signal includes data relative to said estimation. This enables to plan in advance a maintenance operation, including a replacement of the device, before any failure of said device.

Other features, details and advantages will be shown in the following detailed description and on the figures.

DESCRIPTION OF EMBODIMENTS

Figures and the following detailed description contain, essentially, some exact elements. They can be used to enhance understanding the invention and, also, to define the invention if necessary.

Figure 1:
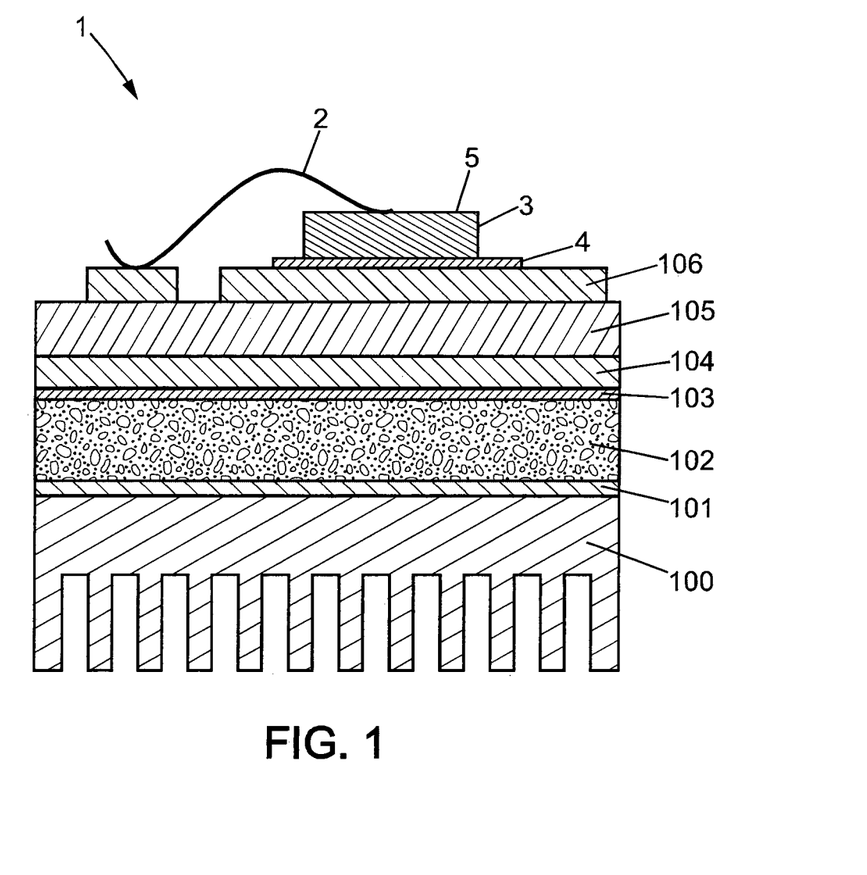
FIG. 1 is a sectional side view of a device according to the invention before fixing of the optical guide.

FIG. 1 shows an example of a device 1 comprising a superposition of layers. From the bottom to the top, the device 1 comprises a heat-sink 100, a thermal interface 101, a base plate 102, a solder layer 103, a conductive layer 104 (for example in copper), an electrical insulator layer 105 (for example based on aluminum oxide), a conductive layer 106 (for example in copper), a solder layer 4, a semiconductor die 3, a metallization layer 5 and a conductive wire bond 2 ensuring electrical connection between a part of the conductive layer 106 and the metallization layer 5.

The device 1 shown on FIG. 1 is a power module assembly. The semiconductor die 3 can be, for example, an Insulated Gate Bipolar Transistor (IGBT) or a Metal-Oxide-Semiconductor Field-Effect Transistor (MOSFET). It can be made of silicon, silicon carbide (SiC) and/or gallium nitride (GaN). The semiconductor die 3 is a power semiconductor: it is arranged to operate under a voltage superior to 50V and a current superior to 1 A.

The semiconductor die 3 is metalized at least on one of its side, here on its top side. In other words, the semiconductor die 3 is coated with a metallization 5. The top surface of the metallization 5 is referenced 51. The metallization layer is, for example, made of an aluminum alloy. Such a metallization 5 has a thickness comprised between 1 and 20 micrometers. The surface 51 is used to fix wire bonds 2, for example by thermosonic bonding. The free portions of the surface 51 (deprived from wire bonds 2) can be used to dispose at least one light guide 7. In the example described here, when a plurality of spaces of the surface 51 are free, the light guide 7 is disposed as close as possible to the middle of the semiconductor die 3, which is generally the hottest part of the device 1. As a consequence, such a part is submitted to the hardest conditions during the operational life of the device 1.

Figure 2:
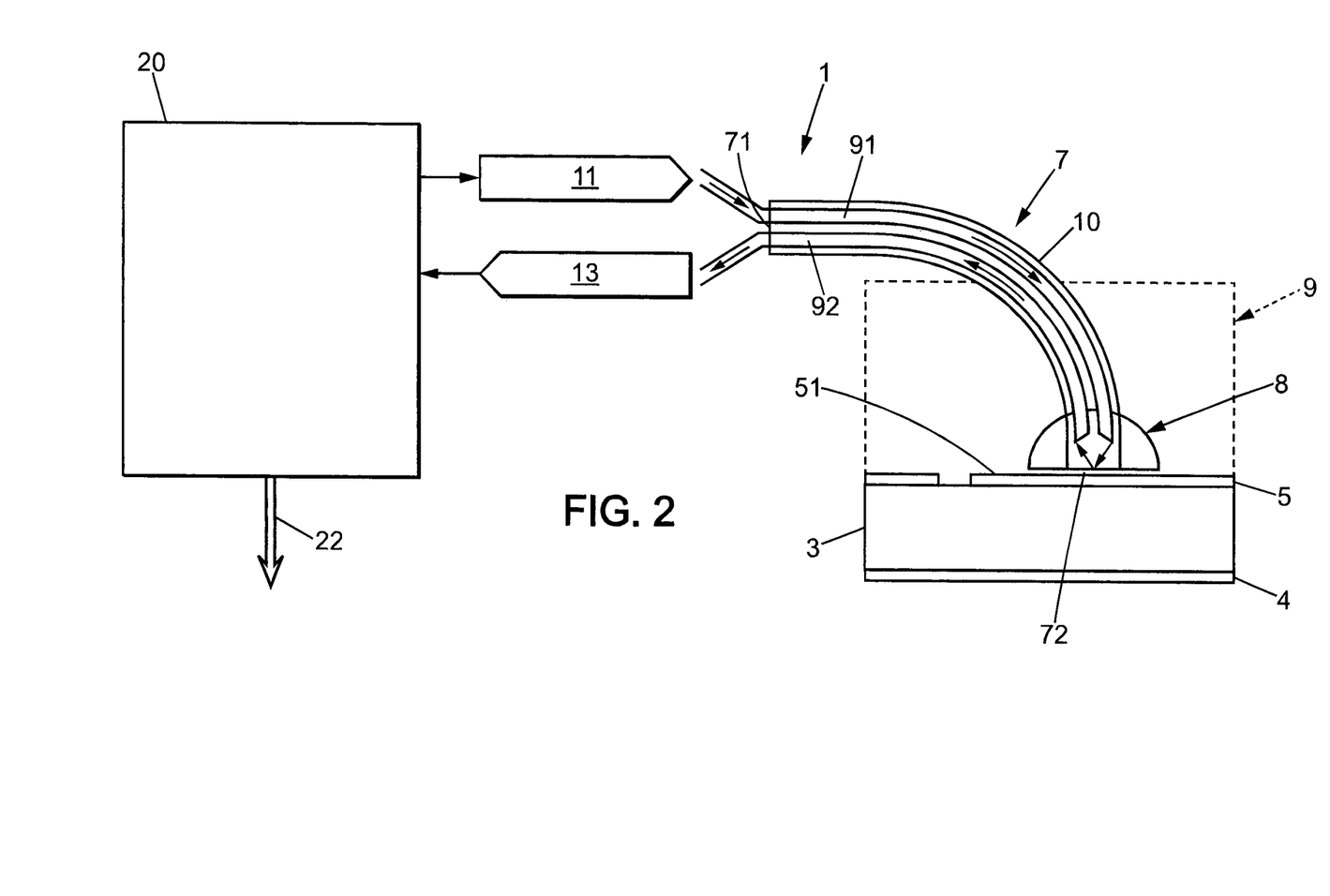
FIG. 2 is a detail view of the device of FIG. 1 after an optical guide being fixed.

FIG. 2 shows a free space of the surface 51 on which a light guide 7 is disposed. The light guide 7 is able to carry a light beam. In the following, the words "light guide" are used to define a single piece, or a set including a plurality of pieces assembled together, or a set including a plurality of pieces distinct one from the others. For example, the light guide 7 can consist of a single optical fiber (see FIG. 9) or can consist of a plurality of optical fibers (see FIGS. 2 to 8). The optical fibers are especially designed to support high temperatures, for example superior to 125° C. For example, silica optical fibers can be used if the planned temperatures are up to 300° C. and allow enhancing the stability under operating temperatures. A light guide 7 comprising a set of at least one optical fiber is also flexible. As a consequence, a light guide 7 can be easily integrated in devices 1 having various area occupancy and/or various volume occupancy close to the surface 51. It improves the design flexibility of the device 1.

In various embodiments, the optic fibers can be replaced by other means, for example solid bars fixed with respect to the surface 51 and made of a material able to conduct light.

The light guide 7 has two opposite ends 71, 72. The first end 71 is able to be connected to a light source 11 and/or to a light receiver 13. The first end 71 is distant from the surface 51. The second end 72 is fixed facing to the surface 51 of the metallization 5. In operation, the light guide 7 forms a light path 91 until the surface 51 and/or a light path 92 from the surface 51.

For example, the light source 11 can be a low-cost light emitting diode (LED) or a Laser diode. The light source 11 is associated to a power supply and a drive circuit (not shown on figures). The drive circuit is typically controlled by a processor, for example the processor 20 that will be described hereinafter. The processor decides when the light is generated.

The light receiver 13 is arranged to measure the intensity and/or the wavelength of the collected light. Commercially available light receiver can be used such as photo-conductive cells (e.g. light dependent resistor), and photo-junction devices (e.g. photodiode or phototransistor). The light receiver 13 generates an output electrical signal indicating the intensity and/or the wavelength of light. The light receiver 13 is associated to a power supply and a signal conditioning circuit (not shown on figures) to generate a voltage value that can be acquired by an analog-to-digital converter. After conversion the signal is treated by a processor, for example the processor 20 that will be described hereinafter. The signal conditioning circuit contains, for example, at least one operational amplifier (op-amp).

In the example of FIG. 2, the light guide 7 comprises two optical fibers. The two optical fibers can be, for example, structurally analogous. In an operational state, each one of the two optical fibers forms respectively the first light path 91 until the surface 51 and the second light path 92 from the surface 51. The line paths 91, 92 are different essentially by the direction of the guided light.

The light guide 7 enables to dispose the light source 11 and/or the light receiver 13 distant from the semiconductor die 3. The light source 11 and the light receiver 13 are protected against high temperature and electro-magnetic interferences.

The light guide 7, especially the second end 72, is permanently positioned with respect to the surface 51. In other words, the relative position of the light guide 7 and the metallization 5 is not planned to be modified in normal condition of use and during the operational life of the device 1. In the described example, the device 1 further comprises an assembling material 8 between the second end 72 and the surface 51. The assembling material 8 comprises, for example glue, resin or gel. The composition and the thickness of the assembling material 8 are selected to preserve a high transparency during the operational life of the device 1, especially when submitted to high temperatures. Here, the word "transparency" or "transparent" has to be understood as having attenuation inferior to 2 dB/m for the wavelength of the light source 11 when the temperature is comprised in the operating range which is typically −40° C. to 150° C.

In the embodiment shown on FIG. 2, the space above the metallization 5 is filled by a filler material 9, for example a silicone gel. In such a case, the light guide 7 is encapsulated in the filler material 9. In the embodiment on FIG. 2, the filler material 9 is added after fixing of the light guide 7. Such a filler material 9 reduces the contact between electronical components of the device 1 and the air, especially oxygen ($O_2$) and water ($H_2O$). The corrosion effects are reduced. The filler material 9 can be a protective gel. Such a device 1 can comprise a casing to contain the filler material 9. In embodiments including a transparent filler material 9 on the top of the semiconductor die 3, the second end 72 of the light guide 7 can be disposed in the filler material 9. The assembling material 8, such as glue, can be absent and replaced by the filler material 9. The protection can also be ensured by a film coated on the surface 51. The light guide 7 can be embedded into such a film. In molded power modules, the filler can be an opaque molding compound. In such a case, the use of a transparent assembling material is preferred.

In various embodiments, the semiconductor die 3 is embedded in a printed circuit board (PCB). In such a case, the light guide 7 can be also embedded in the PCB. The device 1 can be deprived of assembling material 8 and/or filler material 9.

In the example of FIG. 2, the light guide 7 comprises a sheath 10. The optic fibers are inserted together into the sheath 10. In various embodiments, the sheath 10 is absent. The optic fibers are naked and directly fixed with respect to the surface 51.

Figure 3:
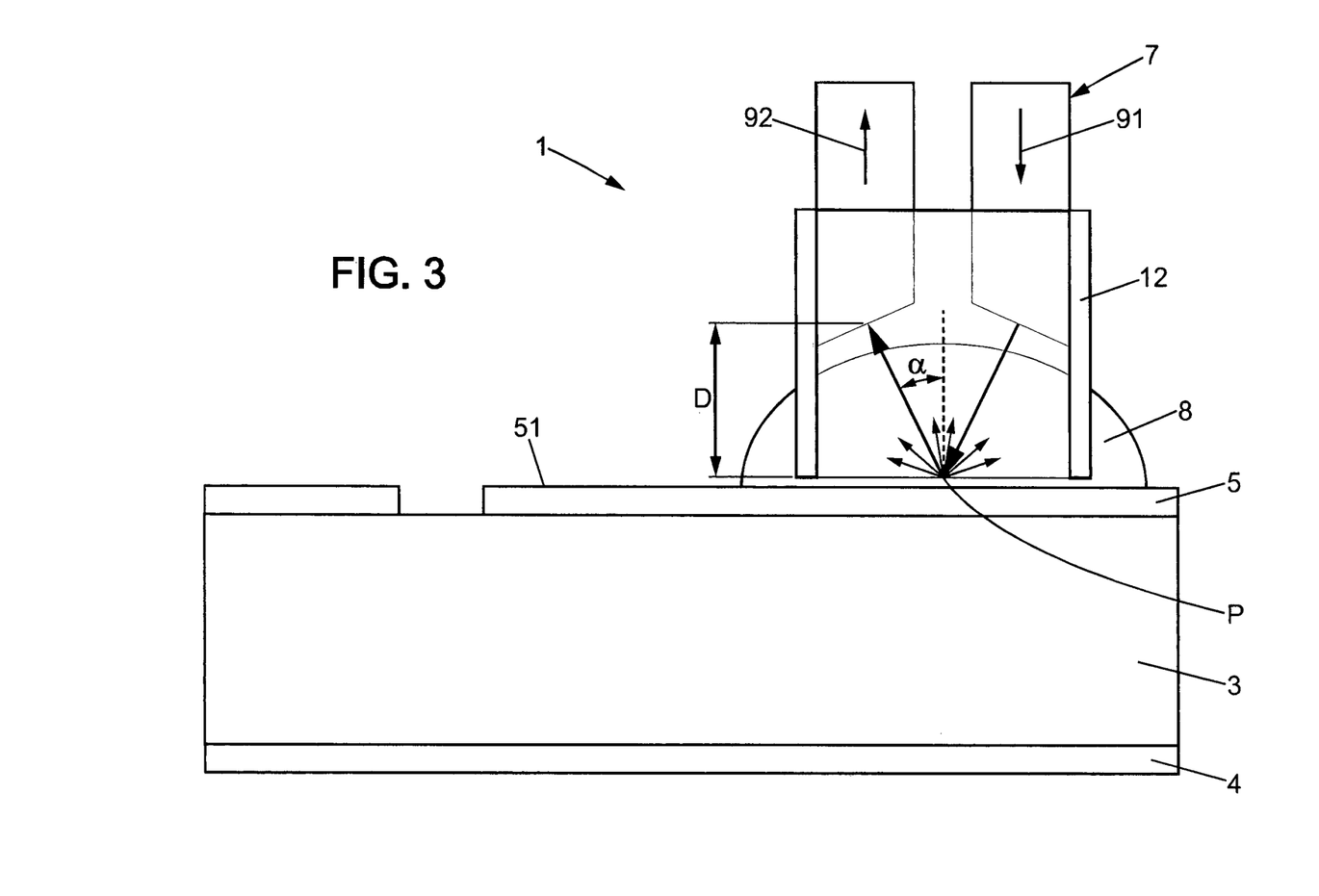
FIG. 3 is a detail schematic view of a device according to the invention.

In the embodiment of FIG. 3, the device 1 further comprises a spacer 12. The light guide 7 is fixed on the power semiconductor die 3 via the spacer 12. The spacer 12 defines the distance and the relative orientation between the second end 72 of the light guide 7 and the metallization 5. On the example of FIG. 3, the spacer 12 has a form of a tip (a mouth piece) threaded around the terminal portion of the optic fibers. The spacer 12 can have various forms. For example, a terminal portion of the sheath 10 of FIG. 2 can form a spacer.

In the embodiment of FIG. 3, the conformation of the terminal surface of the second end 72 of the light guide 7 and the relative position of the second end 72 with respect to the surface 51 of the metallization 5 are conjointly selected such that the most part of the light outputting from the first light path 91 is reflected on an area P of the surface 51 and then take the second light path 92. The terminal surface of each one of the two optic fibers is designed in a bevel form. The bevel forms of the two optic fibers are substantially symmetric one to the other. In an operational state, a light beam outputting from the first light path 91 (here corresponding to an optic fiber) is oriented toward the area P, which is an area in the order of magnitude of the light guide operational section, and hit the surface 51 on the area P. For example by application of Snell-Descartes laws, a man skilled in the art can conjointly adjust the distance D between the second end 72 and the surface 51, the refraction angles and the reflective angle α, the refraction indexes, the distance between the two light path 91, 92, the bevels forms and the spacer 12 in order to make such that the second path 92 captures as much light as possible when the surface 51 of the metallization 5 is not damaged (smooth).

In various embodiment, a light reflector/refractor piece can be used to replace the bevel forms or by combination with bevel forms.

In the embodiments of FIGS. 2 and 3, the major part of the light beam is reflected until the second light path 92 when the surface 51 is planar, smooth and highly reflective. In other words, the major part of the light beam outputting from the first light path 91 is collected by reflection in the second light path 92 of the light guide 7.

During the operational life of the device 1, the surface 51 is deteriorated. Defects and irregularities appear. The roughness increases. The reflexivity and the shining decrease. The quantity of the light collected in the second light path 92 is reduced. For example, at least a portion of the light beam hits irregularities and is reflected outside from the light guide 7. Such a decreasing of the collected light can be used to detect deterioration of the surface 51 and, then, to estimate the wear of the device 1.

In a various embodiment, properties of the light collected in the second light path 92 are compared to at least one reference. The following are examples of comparison that can be made:
  the collected light intensity with respect to a preset value,
  the collected light intensity with respect to a collected light intensity in the past, for example when the device is novel and in a quasi-perfect state (obtained during a calibration step),
  the collected light intensity with respect to the emitted light intensity,
  the collected light intensity with respect to a collected light intensity issued from a reference measurement (see FIG. 5),
  the collected light wavelength with respect to a preset value,
  the collected light wavelength with respect to a collected light wavelength in the past, for example when the device is novel and in a quasi-perfect state (obtained during a calibration step),
  the collected light wavelength with respect to the emitted light wavelength,
  the collected light wavelength with respect to a collected light wavelength issued from a reference measurement (see FIG. 5),
  a combination of the above comparisons.

Figure 4:
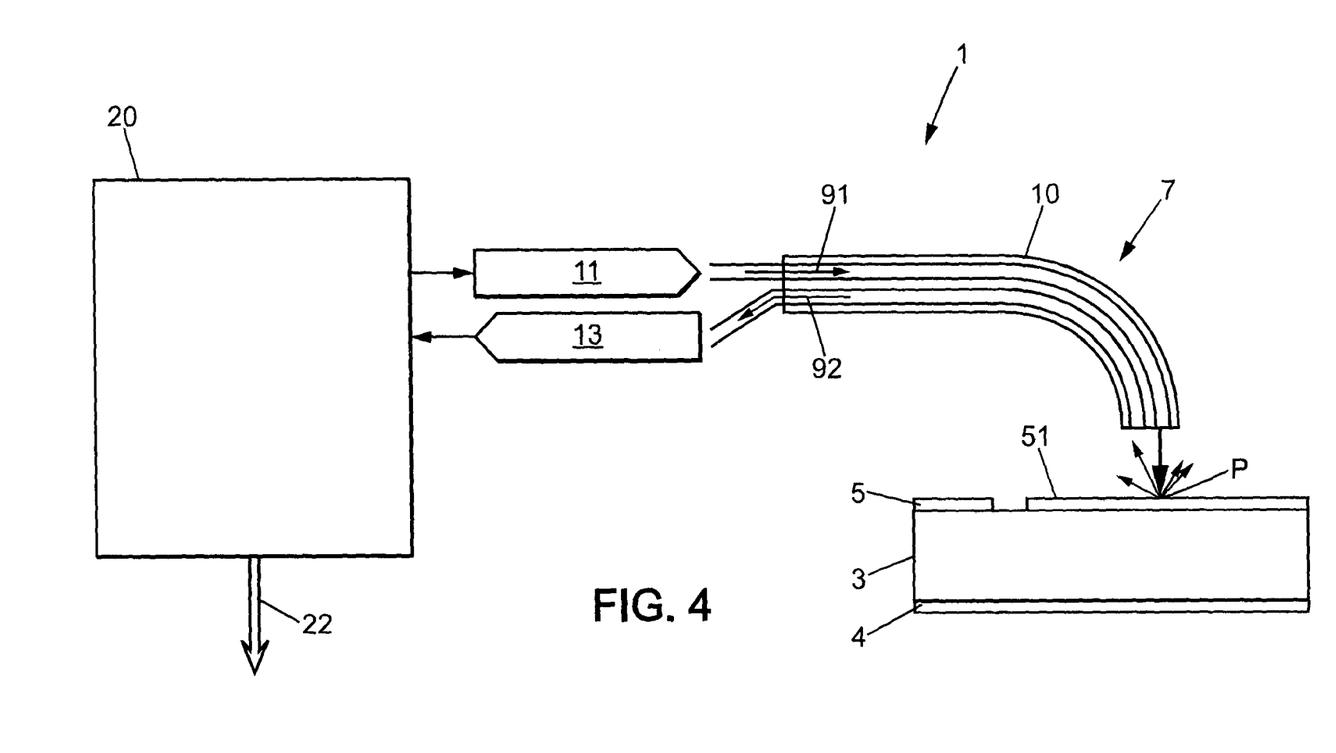
FIG. 4 is a detail schematic view of a device according to the invention.

The comparisons can be made in an absolute value. For example and as shown on the embodiment of FIG. 4, the second end 72 of the light guide 7 is not necessarily designed to collect the most part of the reflective beam in the initial state of the surface 51. As a consequence, the collected light intensity could increase and can also decrease when the state of the surface 51 is getting worse during time. The two directions of variation can be interpreted as a degradation of the surface 51 state.

Monitoring the wavelength evolution enables to detect iridescence effects of the surface 51. Such a parameter can also be used to estimate the degradation of the surface 51 state. In such a case, the comparisons are preferably made for two similar temperatures, or by deducting the wavelength variation part due to the temperature variations.

Figure 5:
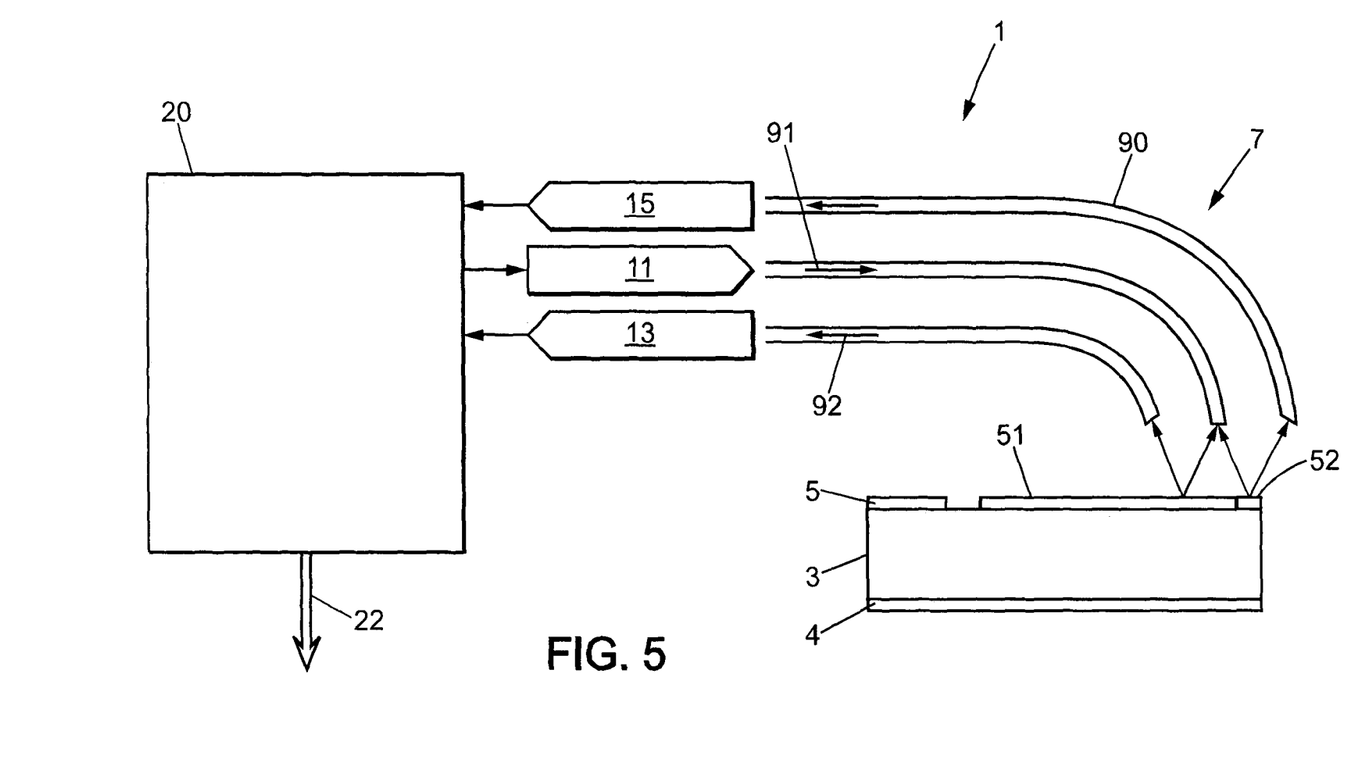
FIG. 5 is a detail schematic view of a device according to the invention.

In the embodiment of FIG. 5, the device 1 comprises a reference portion 52 of the surface 51. The device 1 further comprises a reference light path 90. The conformation of the terminal surface of the second end 72 of the light guide 7 and the relative position of the second end 72 with respect to the surface 51 of the metallization 5 are conjointly selected such that:
  a part of the light outputting from the first light path 91 is reflected on an area P of the surface 51 and then takes the second light path 92, and such that
  another part of the light outputting from the first light path 91 is reflected on the reference portion 52 and then takes the reference light path 90.

For example, the terminal surface of each one of the optic fibers forming the second light path 92 and the reference light path 90 is designed in a bevel form. The bevel forms of the two optic fibers are substantially symmetric one to the other. The terminal surface of the optic fiber forming the first light path 91 is designed in a double-bevel form (or a pointed form, or a conical form). In a various embodiment, the terminal portion of the first light path 91 is equipped with a light splitter to divide the light beam into two light beams oriented respectively toward the area P and toward the reference portion 52.

The reference portion 52 is selected, or especially designed, to have stable surface properties during time and when submitted to the planned operational conditions. The reference portion 52 can comprise another area of the semiconductor die 3 or an area where the semiconductor die is attached such as a Direct Bounded Substrate (DBC).

The first end 71 is able to be connected to a second light receiver 15. The properties of the light collected by the second light receiver 15 can be used as reference values as above described. For example, at least one value issued from the second light receiver 15 can be subtracted from a corresponding value issued from the light receiver 13. This enables to compensate measured variations due to other parameters than the wear of the critical parts of the device 1, such as degradation of the analog circuits, light emitters, light receptors and light guides. The accuracy of the health estimation is improved.

Figure 6:
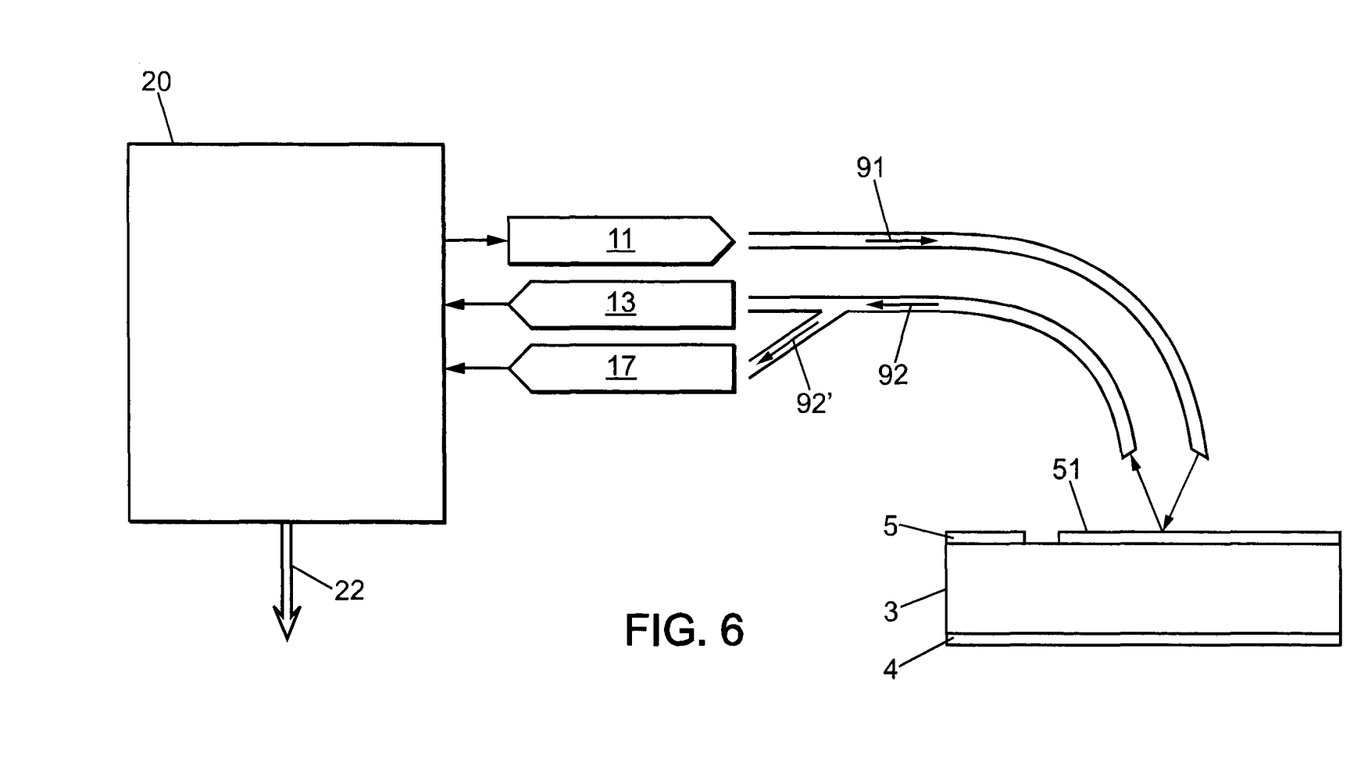
FIG. 6 is a detail schematic view of a device according to the invention.

FIG. 6 shows an embodiment of a device 1 further comprising an annex light path 92'. The annex light path 92' is derived from the second light path 92, for example by using a light splitter. In a various embodiment, an entire dedicated annex light path can be added to the light guide 7 and being independent from the second light path 92. The first end 71 of the annex light path 92' is able to be connected to an infra-red light receiver 17. The temperature of the device 1, especially the surface 51, can be estimated, including when the light source 11 is not emitting light.

The infra-red light receiver 17 may be the same as the first light receiver 13, assuming its spectral responsivity covers at least some infra-red wavelengths (0.7 μm to 20 μm). The temperature can be monitored continuously in order to detect over-temperature phenomena. Such phenomena can be used to trigger a stop of the operations or specific measures to decrease the load. The temperature cycles can also be counted and/or be notified to the user.

Figure 7:
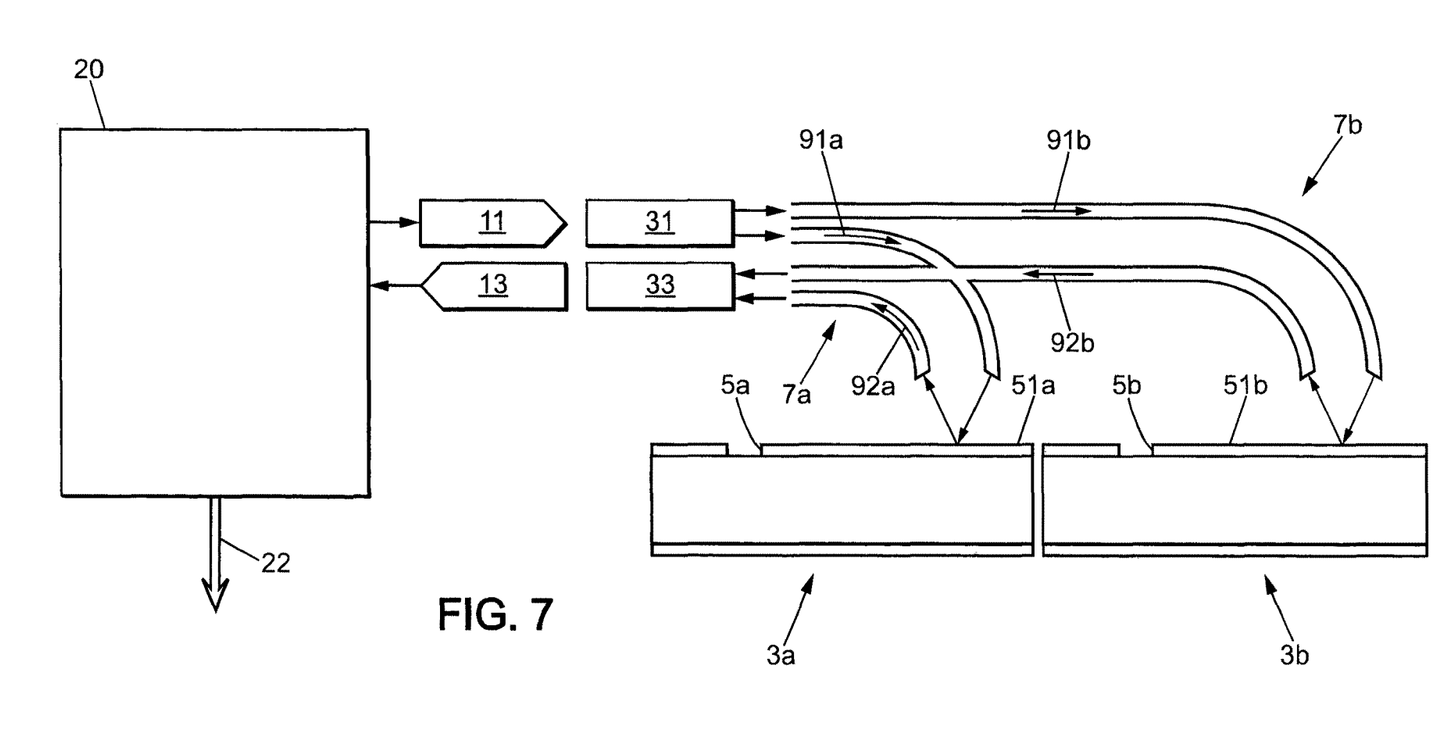
FIG. 7 is a detail schematic view of a device according to the invention.

FIG. 7 shows an embodiment of a parallel monitoring. The device 1 comprises at least two power semiconductor dies 3a, 3b coated with a metallization 5a, 5b and each associated to a respective light guide 7a, 7b.

The first assembly including the first power semiconductor die 3a and the first light guide 7a and/or the second assembly including the second power semiconductor die 3b and the second light guide 7b can be similar one to the other and/or can be similar to at least one of the embodiments and various embodiments above described.

Each light guide 7a, 7b has a first end and a second opposite end. The two first ends are connected to a common light source 11 through a light splitter 31. The two first ends are also connected to a common light receiver 13 through a light coupler 33. The light source 11 emits light toward the two first light paths 91a, 91b. The light receiver 13 receives light from the two seconds light paths 92a, 92b. The two second ends are permanently fixed facing to the corresponding surface 51a, 51b of the respective metallization 5a, 5b.

FIG. 7 shows a device 1 with two assemblies. In various embodiments, a device 1 comprises more than two assemblies. Thus, several power semiconductor dies can be conjointly monitored and the source and receptor parts are mutualized. The light splitter 31 is arranged to divide/share the light beam into the different light paths 91a, 91b. The division may be temporal. For example, the light beam is sent to one light path 91a for a time duration, for example 1 second, and then is switched to the other light path 91b for a time duration, for example 1 second. The division may be related to the wavelength. For example, the wavelengths from 300 nm to 400 nm are sent to one light path 91a and the wavelengths from 400 nm to 500 nm are sent to the other light path 91b. The division may be related to the intensity, for example, half of the intensity goes into one light path 91a and the other half goes into the other light path 91b.

The light coupler 33 regroups/aggregates the incoming light beams from the different light paths 92a, 92b. For example, the light coupler 33 is a mechanical fixture that allows all the receiving light paths 92a, 92b to be guided toward a single light receiver 13.

Figure 8:
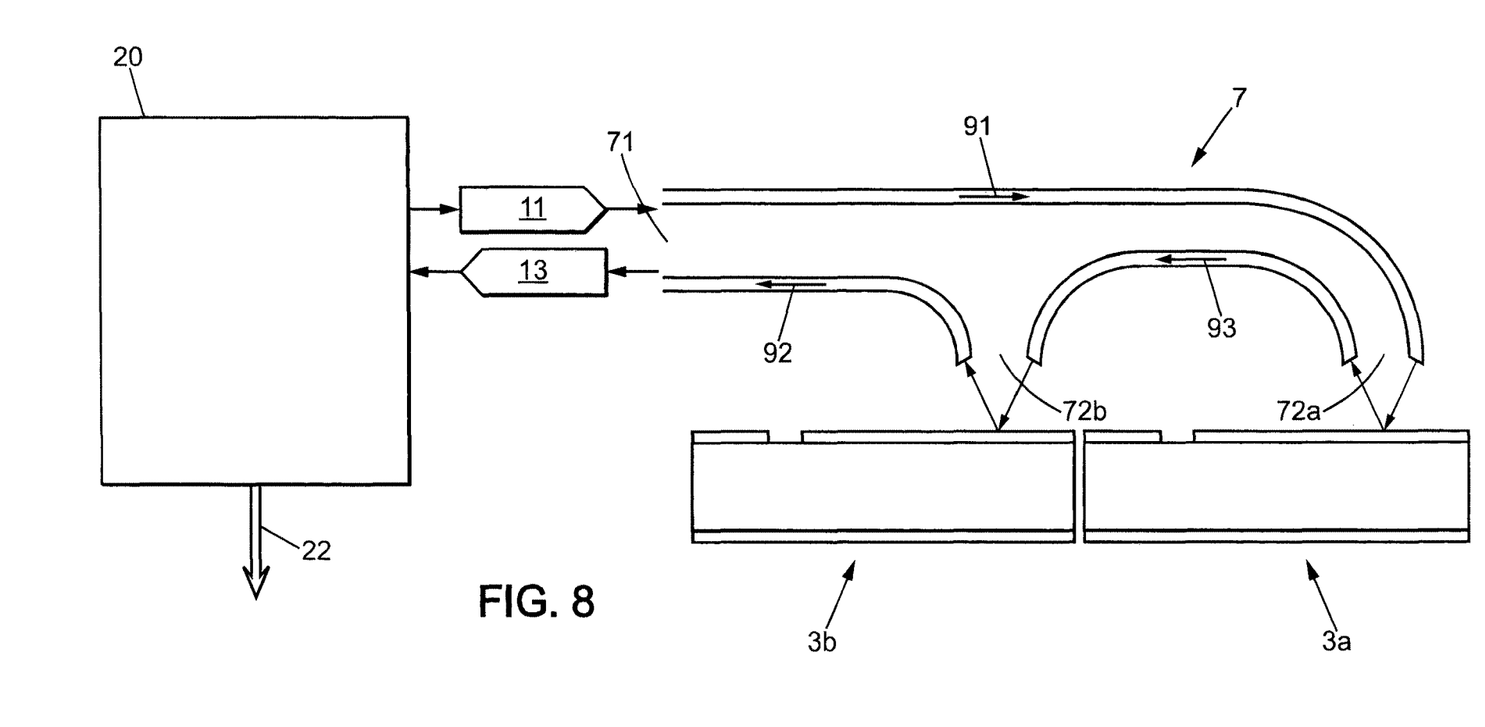
FIG. 8 is a detail schematic view of a device according to the invention.

FIG. 8 shows an embodiment of monitoring in series. The device 1 comprises two power semiconductor dies 3a, 3b coated with a metallization 5a, 5b and a common light guide 7. The light guide 7 includes a single first end 71. The light guide 7 includes as many distinct second ends 72a, 72b as semiconductor dies 3a, 3b (two in the example of FIG. 8). The second ends 72a, 72b are permanently fixed facing to a respective surface 51a, 51b of each metallization 5a, 5b. A first light path 91 is formed from the first end 71 until a first surface 51a of the two surfaces 51a, 51b. A second light path 92 is formed from the second surface 51b of the two surfaces 51a, 51b to the first end 71. The light guide 7 further includes an intermediate light path 93 between the two second ends 72a, 72b. The intermediate light path 93 is arranged to collect a light beam reflected from the first surface 51a and to guide said light beam until the other surface 51b.

Figure 9:
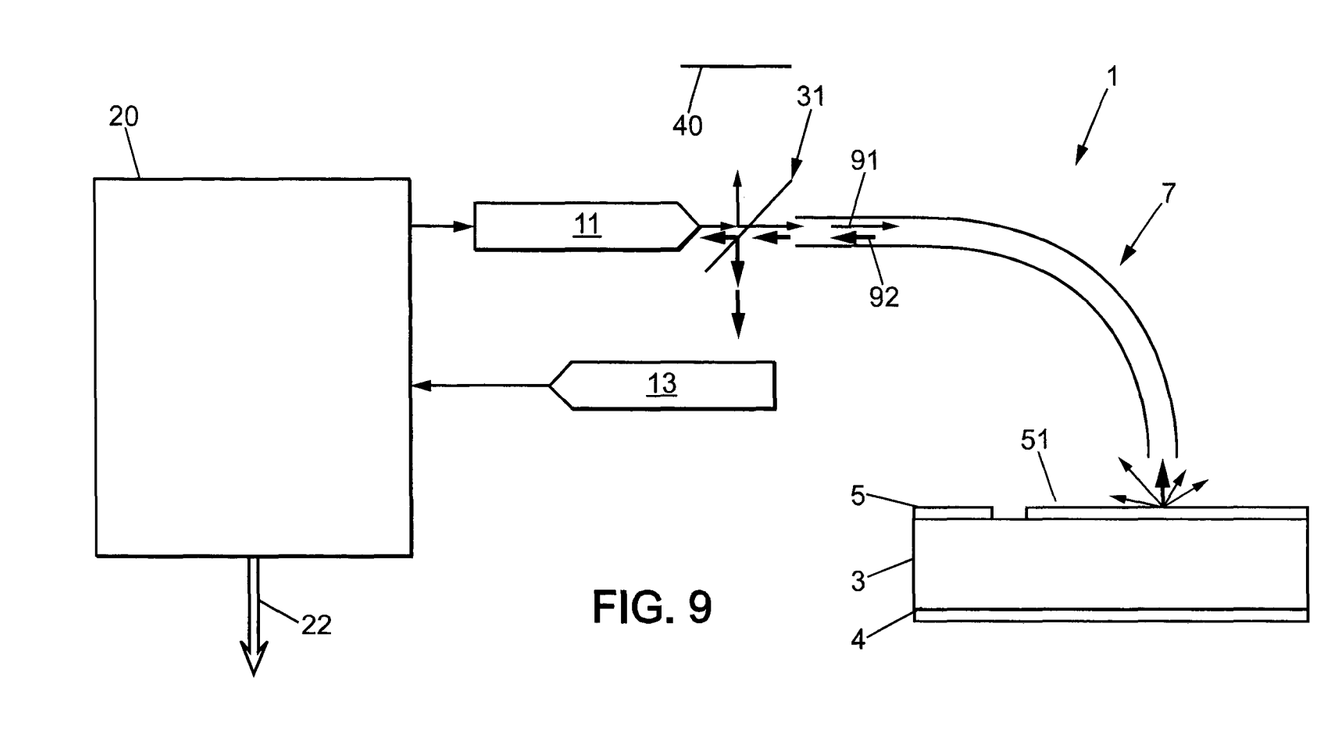
FIG. 9 is a detail schematic view of a device according to the invention.

FIG. 9 shows an embodiment of a device 1 wherein the light guide 7 comprises a single optical fiber forming both the first and second paths 91, 92. A beam splitter 31 is interposed between the first end 71, and a couple of the light source 11 and the light receiver 13. The beam splitter 31 separates the beam sent to the semiconductor die 3 and the beam received from the semiconductor die 3. The beam splitter 31 comprises, for example, a half-transparent mirror. The transmitted part of the emitted light beam is transmitted to the surface 51 by the light guide 7. A portion of this light beam is reflected by the surface 51 and captured by the light guide 7 (here the same optic fiber). This light beam is sent to the beam splitter 31, and a portion of it is reflected towards the light receiver 13.

Here, the device 1 further comprises a mirror 40, which is optional. The part of the emitted light reflected by the beam splitter 31 is then reflected by the mirror 40, and sent back to the beam splitter 31 where the transmitted portion is also sent to the light receiver 13, together with the reflected portion corresponding to the light beam reflected by the semiconductor die 3. In the case of a monochromatic light source (e.g. laser), the interferences (e.g. partial addition or subtraction) between the two light beams may be captured by the light receiver 13. If the two light beams have a phase shift of 7C, the intensity of the received light will be inversely proportional to the reflected light and thus can be considered as a measure of the surface 51 degradation. This is an alternative optical method to make a difference before the pre-processing ensured by computer means.

In the above described embodiments, the first end 71 of the light guides 7 are able to be connected to a light source 11, a light receiver 13, a second light receiver 15, an infra-red light receiver 17, a light/beam splitter 31 and/or a light coupler 33. Such elements are able to be operatively coupled to at least one processor 20, or generally a control unit, which will be described after.

The device 1 can be deprived from such elements. For example, the device 1 can be fabricated in a first step and provided without light source 11, light receiver 13, second light receiver 15, infra-red light receiver 17, light/beam splitter 31, light coupler 33 and/or processor 20. For example, the first end 71 is free or protected by a cap. In such a case, the first end 71 can be seen as a "diagnostic plug" of the device 1. During normal operations, the device 1 can also be deprived from the listed elements. The listed elements are only temporarily plugged to the first end 71 when they are used, for example during checking/maintenance operations.

In other embodiments, the device 1 further comprises at least one of the listed elements. The device 1 can be provided as a kit having an assembly including a power semiconductor module equipped with at least one light guide 7, and a set of pluggable elements ready to be assembled to the light guide 7. The device 1 can also be provided as an assembly including a power semiconductor module equipped with at least one light guide 7 and a set of elements already assembled to the light guide 7, for example definitively attached to the light guide 7. For example, if the processor 20 is continuously connected to the other elements during operations of the device 1, the monitoring can be made continuously or occasionally without waiting for specific maintenance operations. An output signal 22 can be emitted toward a user, including during normal operation of the device 1. The output signal 22 can comprise data like a routine signal to monitor the status of the device 1 and/or an alert signal sent only when a defect is detected.

A method to monitor a power semiconductor die 3 coated with a metallization 5 can comprise:
a) fixe permanently a light guide 7, 7a, 7b facing to a surface 51, 51a, 51b of the metallization 5,
b) collect through said light guide 7, 7a, 7b a light beam reflected on said surface 51, 51a, 51b, c) convert the collected light beam into an electric signal,
d) compare said signal to at least one reference,
e) generate a monitoring signal 22 in function of the result of the comparison.

The step c) can be made by the light receiver 13 as above described, the electric signal being transmitted to the processor 20. The processor 20, or any other adapted computer resources, can be arranged to ensure the comparison step d) and/or the signal generation step e), for example based on the comparisons as described before.

Figure 10:
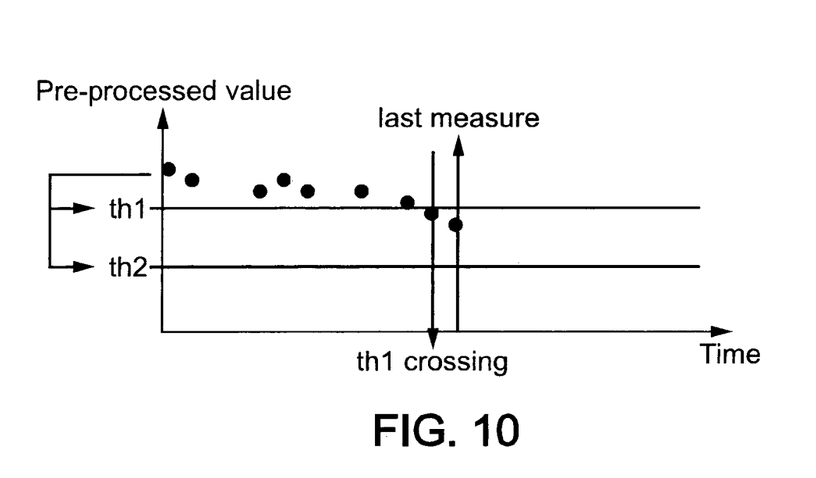
FIG. 10 is a graphic of a monitoring procedure according to the invention.
Figure 11:
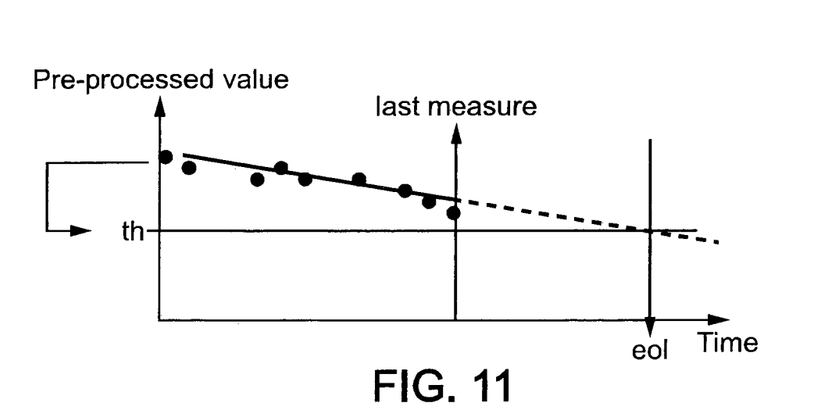
FIG. 11 is a graphic of a monitoring procedure according to the invention.

FIGS. 10 and 11 show examples of graphics based on such a monitoring process. In the examples, a collected light intensity is represented in function of the time. th, th1 and th2 are reference values.

In some embodiments, the processor 20 is arranged to decide on the instant when the condition monitoring is realized. One example is every day, week, year, or at each start-up of the system. The processor 20 sends a signal to the light source 11 to generate light. The processor 20 receives a signal issued from the light receiver 13, here by the intermediate of an analog-to-digital converter. The signal is pre-processed, for example by averaging, or applying a gain. The pre-processed signal is optionally stored in a memory associated to the processor 20. The processor 20 uses the stored values in order to estimate the state of health of the device 1. The processor 20 sends an outputting signal 22. The outputting signal 22 can be sent to a user or to another system. The outputting signal 22 can be a warning/alert signal indicating of the state of health of the device 1.

For example, the first stored value (i.e. the initial pre-processed value corresponding to the signal received by the light receiver 13 in an initializing step) is used to define at least one threshold value (two threshold values th1 and th2 in the example of FIG. 10, one threshold value th in the example of FIG. 11). The values then acquired after (during the operational life) are compared to these threshold values (or reference values). In the example of FIG. 10, if the measured value is lower than th1, a first damage information is generated. If the measured value is lower than th2, a second damage information is generated. The damage information indicates the state of health (i.e. the degradation level). The damage information may also indicate that the short-circuit capability is reduced to a certain level due to the increase of the metallization resistivity, itself decreasing the ability to filter energy spikes. The information is, for example, provided to a higher level processor. The damage information can be combined to other information and used to take actions such as planning a maintenance/replacement or changing the operation of the system in a mode that decreases the stress imposed to the device 1.

In the example of FIG. 11, the stored measured values can be used to estimate a remaining time before that the values becomes lower than the threshold th, which correspond to the estimated end of life (eol) of the device 1. The replacement of the device 1 before the end of life of the device 1 can be planned during an already planned maintenance operation. An urgent and specific intervention can be avoided.

The features associated to an embodiment in the description can be combined one with others. The invention is not limited to the devices, assemblies and process described here, which are only examples. The invention encompasses every alternative that a person skilled in the art would envisage in the scope of the following claims.

The invention claimed is:

1. A device for monitoring a power semiconductor die coated with a metallization, comprising:
   at least one power semiconductor die coated with a metallization;
   at least one light guide having two opposite ends, a first end being able to be connected at least to a light source and to a light receiver, the second end being permanently fixed facing to a surface of the metallization such that to form a light path towards said surface and a light path from said surface; and
   an assembling material for use with the second end of the at least one light guide and the surface of the metallization to preserve a transparency of the device, wherein the second end of the at least one light guide is located approximately at the middle of the at least one power semiconductor die and directly adjacent to the metallization, such that the second end of the at least one light guide is not disposed within the metallization.

2. The device according to claim 1, wherein said light source and said light receiver are both connected to the first end of the light guide, at least the light receiver being able to be connected to a processor.

3. The device according to claim 2, further comprising the processor connected at least to the light receiver, said processor comparing properties of the light collected by the light receiver to at least one reference, said reference comprising at least one of the followings:
   a predetermined value,
   the intensity of the light emitted by the light source, the processor being further connected to the light source,
   an intensity of the light collected by the light receiver in the past,
   the intensity of the light collected by a second light receiver to which the processor is connected, and
   the wavelength of the light emitted by the light source, the processor being further connected to the light source,
   the processor further generating a monitoring signal in function of the result of the comparison.

4. The device according to claim 3, further comprising at least one light splitter disposed on a light path between the first end of the light guide and at least a light source or a light receiver.

5. The device according to claim 4, wherein the light guide includes at least two light paths, the first light path being arranged to guide a light beam from the first end until said surface of the metallization, the second light path being arranged to guide a light beam from the second end until the first end of the light guide.

6. The device according to claim 3, wherein the light guide includes at least two light paths, the first light path being arranged to guide a light beam from the first end until said surface of the metallization, the second light path being arranged to guide a light beam from the second end until the first end of the light guide.

7. The device according to claim 2, further comprising at least one light splitter disposed on a light path between the first end of the light guide and at least a light source or a light receiver.

8. The device according to claim 7, wherein the light guide includes at least two light paths, the first light path being arranged to guide a light beam from the first end until said surface of the metallization, the second light path being arranged to guide a light beam from the second end until the first end of the light guide.

9. The device according to claim 2, wherein the light guide includes at least two light paths, the first light path being arranged to guide a light beam from the first end until said surface of the metallization, the second light path being arranged to guide a light beam from the second end until the first end of the light guide.

10. The device according to claim 1, further comprising at least one light splitter disposed on a light path between the first end of the light guide and at least a light source or a light receiver.

11. The device according to claim 10, wherein the light guide includes at least two light paths, the first light path being arranged to guide a light beam from the first end until said surface of the metallization, the second light path being arranged to guide a light beam from the second end until the first end of the light guide.

12. The device according to claim 1, wherein the light guide includes at least two light paths, the first light path being arranged to guide a light beam from the first end until said surface of the metallization, the second light path being arranged to guide a light beam from the second end until the first end of the light guide.

13. The device according to claim 12, wherein the conformation of a terminal surface of the second end of the light guide and the relative position of the second end with respect to the surface of the metallization are conjointly selected such that, the most part of the light outputting from the first light path is reflected on an area of the surface and then takes the second light path.

14. The device according to claim 1, further comprising an infrared light receiver connected to the first end of the light guide.

15. The device according to claim 1, wherein the transparency of the device is preserved by a composition and the thickness of said assembling material having an attenuation interior to 2 dB/m for the wavelength of the light source when the temperature is comprised between −40° C. and 150° C.

16. A device for monitoring power semiconductor dies coated with a metallization, comprising at least two power semiconductor dies coated with a metallization and each associated to a respective light guide, each having a first end and a second opposite end, the two first ends being connected to a common light source through a light splitter and being connected to a common light receiver through a light coupler, the two second ends being permanently fixed facing to the surface of the respective metallization such that to form a respective light path until said surface and/or a respective light path from said surface.

17. A device for monitoring power semiconductor dies coated with a metallization, comprising N power semiconductor dies coated with a metallization, N being greater or equal to two; and a common light guide; said light guide including N distinct second ends being permanently fixed facing to a respective surface of each metallization such that to form a light path until a first of the N surfaces and to form a light path from the last of the N surfaces, said light guide further including N−1 intermediate light paths between the second ends each arranged to collect a light beam reflected from one of the N surfaces and to guide said light beam until another surface of the N surfaces.

* * * * *